(12) United States Patent
Fujii et al.

(10) Patent No.: US 12,283,940 B2
(45) Date of Patent: Apr. 22, 2025

(54) VIBRATION DEVICE

(71) Applicant: Seiko Epson Corporation, Tokyo (JP)

(72) Inventors: Masahiro Fujii, Shiojiri (JP); Ryuichi Kurosawa, Hara (JP)

(73) Assignee: SEIKO EPSON CORPORATION (JP)

( * ) Notice: Subject to any disclaimer, the term of this patent is extended or adjusted under 35 U.S.C. 154(b) by 833 days.

(21) Appl. No.: 17/505,713

(22) Filed: Oct. 20, 2021

(65) Prior Publication Data

US 2022/0123716 A1   Apr. 21, 2022

(30) Foreign Application Priority Data

Oct. 21, 2020   (JP) ................................. 2020-176623

(51) Int. Cl.
| | | |
|---|---|---|
| *H03H 9/10* | (2006.01) | |
| *H03H 3/02* | (2006.01) | |
| *H03H 9/19* | (2006.01) | |

(52) U.S. Cl.
CPC ............ *H03H 9/1021* (2013.01); *H03H 3/02* (2013.01); *H03H 9/19* (2013.01); *H03H 2003/022* (2013.01)

(58) Field of Classification Search
CPC ....... H03H 9/1021; H03H 9/19; H03H 9/0547
See application file for complete search history.

(56) References Cited

U.S. PATENT DOCUMENTS

| | | | |
|---|---|---|---|
| 2012/0106085 A1 | 5/2012 | Yamazaki et al. | |
| 2013/0043960 A1* | 2/2013 | Ishii ..................... | H03H 9/1021 29/25.35 |
| 2018/0248516 A1* | 8/2018 | Noto ..................... | H03H 9/0552 |
| 2018/0302032 A1* | 10/2018 | Oya ..................... | H03H 9/02086 |
| 2022/0182033 A1* | 6/2022 | Fujii ..................... | H03H 9/0547 |
| 2022/0285605 A1* | 9/2022 | Fujii ..................... | H10N 30/872 |
| 2023/0033936 A1* | 2/2023 | Fujii ..................... | H03B 5/32 |
| 2023/0268904 A1* | 8/2023 | Fujii ..................... | H03H 9/1021 310/349 |
| 2024/0258202 A1* | 8/2024 | Matzusawa .......... | H01L 23/481 |

FOREIGN PATENT DOCUMENTS

| | | |
|---|---|---|
| JP | 2004-128591 A | 4/2004 |
| JP | 2006-191517 A | 7/2006 |
| JP | 2007-180885 A | 7/2007 |
| JP | 2009-231554 A | 10/2009 |
| JP | 2012-205255 A | 10/2012 |
| JP | 2014-160877 A | 9/2014 |
| JP | 2017-139717 A | 8/2017 |
| JP | 2018-026649 A | 2/2018 |

\* cited by examiner

*Primary Examiner* — J. San Martin
(74) *Attorney, Agent, or Firm* — Harness, Dickey & Pierce, P.L.C.

(57) ABSTRACT

A vibration device includes a semiconductor substrate having a first surface at which an integrated circuit is provided and a second surface that is a rear surface with respect to the first surface, which is a front surface, a vibration element disposed at the first surface, a lid having a recess that opens toward the first surface and a contact surface that is in contact with the first surface, the lid being bonded to the first surface via the contact surface, and a metal layer disposed between the first surface and the contact surface, and at least part of the integrated circuit overlaps with the metal layer in a plan view viewed in the direction of a normal to the first surface.

8 Claims, 9 Drawing Sheets

VIBRATION DEVICE

The present application is based on, and claims priority from JP Application Serial Number 2020-176623, filed Oct. 21, 2020, the disclosure of which is hereby incorporated by reference herein in its entirety.

BACKGROUND

1. Technical Field

The present disclosure relates to a vibration device.

2. Related Art

Vibration devices using piezoelectric vibrators, such as quartz vibrators, have been widely used in electronic apparatuses, such as mobile phones, and there is a need for further reduction in size of the vibration devices as the sizes of the electronic instruments decrease. To reduce the size of a vibration device, there has been a proposed technology for mounting a piezoelectric vibrator on a semiconductor substrate including an integrated circuit and disposing a lid on the semiconductor substrate in such a way that the lid covers the piezoelectric vibrator.

For example, JP-A-2004-128591 discloses a piezoelectric oscillator configured so that a piezoelectric vibrator is directly placed on and coupled to a semiconductor integrated part, that a lid is disposed over the semiconductor integrated part so as to cover the piezoelectric vibrator, and that the lid is firmly attached with an adhesive to the semiconductor integrated part.

JP-A-2017-139717 discloses a piezoelectric oscillator including a first substrate having a front surface at which a circuit section formed and a rear surface on which a vibration element is mounted and a second substrate that is a lid substrate having a recess formed to accommodate the vibration element, the piezoelectric oscillator configured so that the first and second substrates are bonded to each other with the vibration element accommodated in the recess.

However, in the configuration described in JP-A-2004-128591, in which the lid is firmly attached with an adhesive, the lid and the semiconductor integrated part need to be securely attached under pressure at high temperature, so that the semiconductor integrated circuit is likely to be damaged when the lid is firmly attached. Therefore, when the lid is firmly attached with an adhesive, it is necessary to arrange the area where the semiconductor integrated circuit and the lid is firmly attached to the semiconductor integrated part in such a way that the area and the semiconductor integrated circuit do not overlap each other, resulting in a problem of an increase in size of the piezoelectric oscillator.

In the configuration described in JP-A-2017-139717, when the first substrate is ground or polished to reduce the thickness of the piezoelectric oscillator, the front surface of the first substrate, which is the surface where the circuit section is formed, cannot be ground or polished. The rear surface of the first substrate, which is the surface on which the vibration element is mounted, therefore needs be ground or polished before the vibration element is mounted, resulting in a problem of a difficulty in reducing the thickness of the piezoelectric oscillator.

SUMMARY

A vibration device includes a semiconductor substrate having a first surface at which an integrated circuit is provided and a second surface that is a rear surface with respect to the first surface, which is a front surface, a vibration element disposed at the first surface, a lid having a recess that opens toward the first surface and a contact surface that is in contact with the first surface in such a way that the vibration element is accommodated in the recess, the lid being bonded to the first surface via the contact surface, and a metal layer disposed between the first surface and the contact surface, and at least part of the integrated circuit overlaps with the metal layer in a plan view viewed in a direction of a normal to the first surface.

DESCRIPTION OF EXEMPLARY EMBODIMENTS

1. First Embodiment

Figure 1:
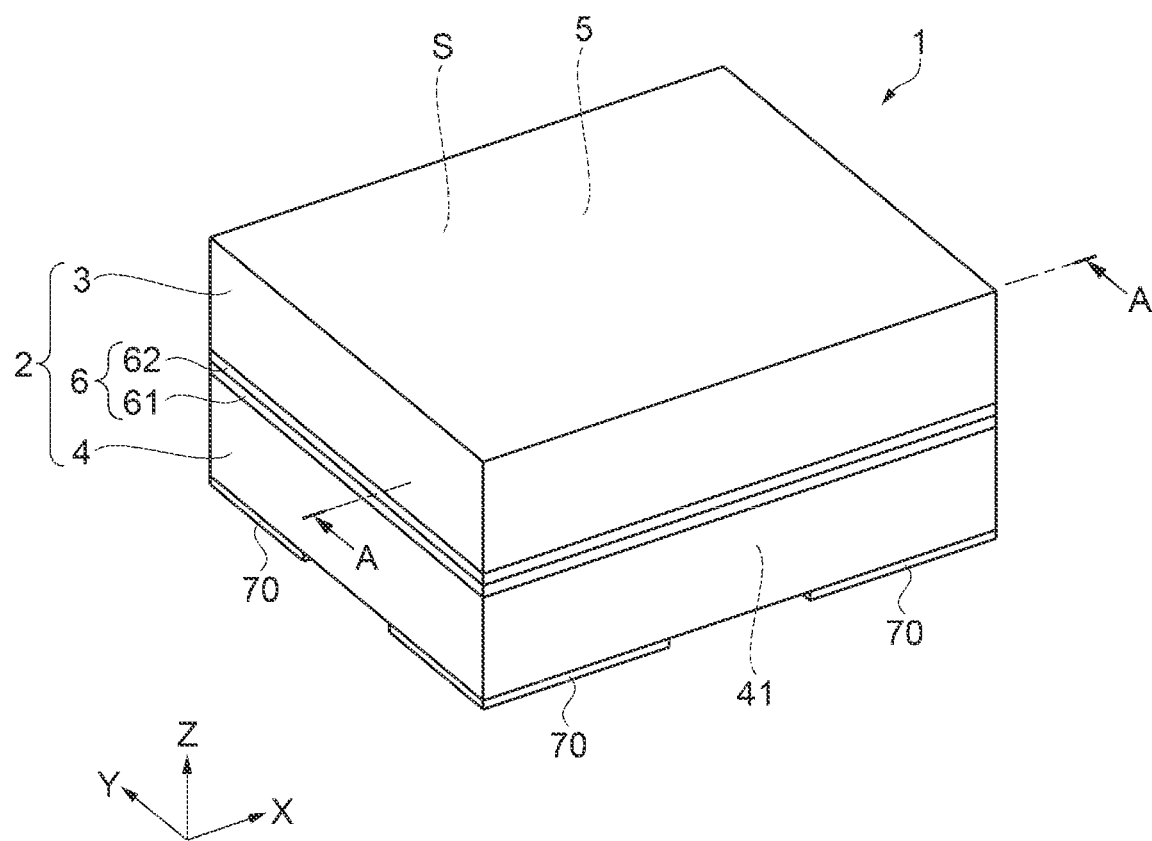
FIG. 1 is a perspective view showing a vibration device according to a first embodiment.

An vibration device 1 according to a first embodiment will be described with reference to FIGS. 1 to 3. FIG. 3 shows the state in which a lid 3 is removed for convenience of description of the internal configuration of the vibration device 1. In the drawings, the dimensional ratio of each component differs from the actual value.

In the coordinate system added to the drawings, the three axes perpendicular to one another are called an axis X, an axis Y, and an axis Z in the description. The direction along the axis X is a "direction X", the direction along the axis Y is a "direction Y", and the direction along the axis Z is a "direction Z", with the side indicated by the arrow being the positive side. It is assumed in the description that the direction Z is the "direction of a normal", that the positive side of the direction Z is "upper" or "upward", and that the negative side of the direction Z is "lower" or "downward". It is further assumed in the description that in the plan view viewed in the direction Z, a surface on the positive side of the direction Z is a upper surface, and that a surface on the opposite side or the negative side of the direction Z is a lower surface.

Figure 2:
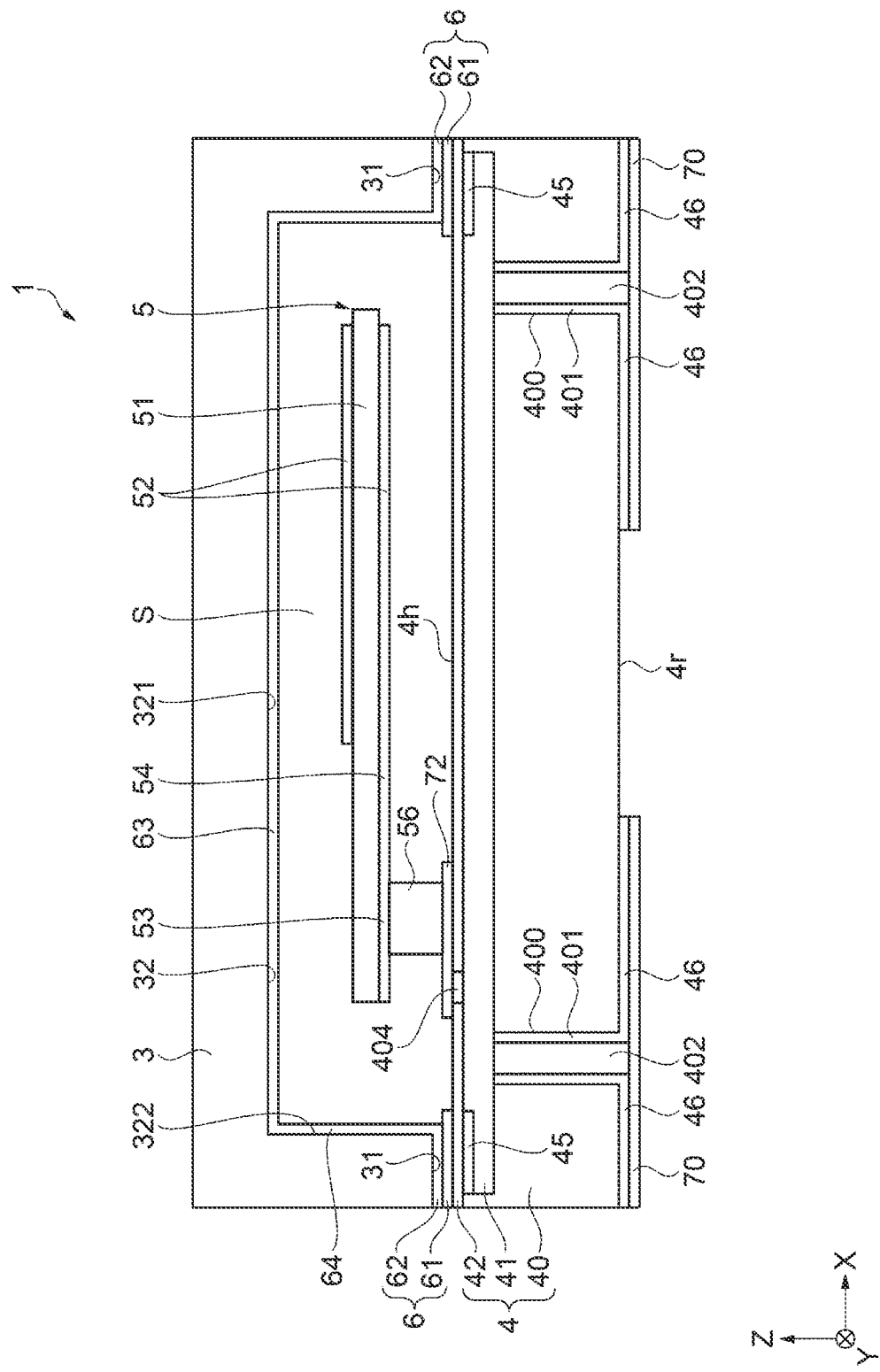
FIG. 2 is a cross-sectional view taken along the line A-A in FIG. 1.
Figure 3:
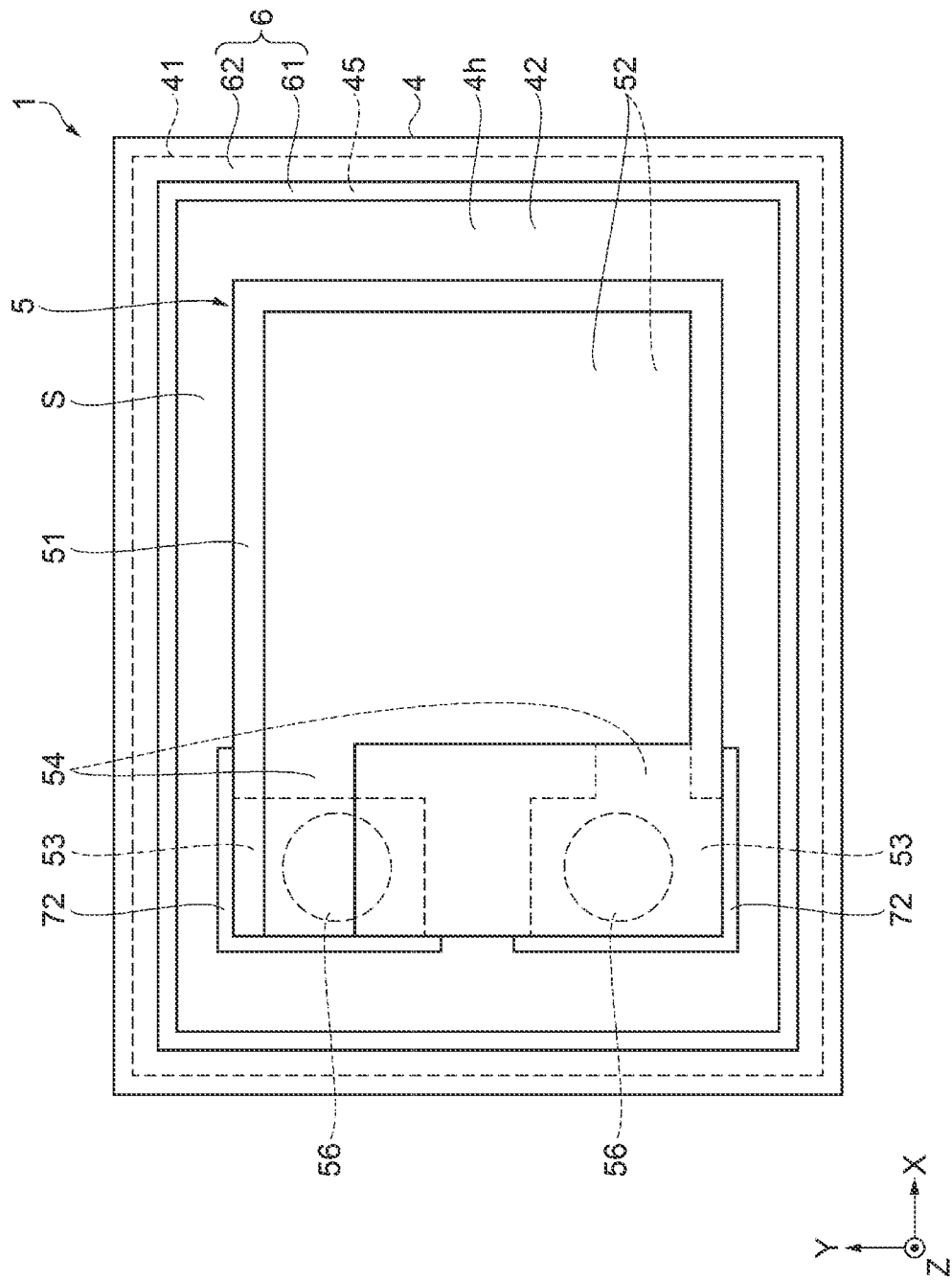
FIG. 3 is a plan view showing a schematic configuration of the vibration device according to the first embodiment.

The vibration device 1 includes a vibration element 5 and a package 2, which accommodates the vibration element 5, as shown in FIGS. 1 and 2. The package 2 includes a semiconductor substrate 4, the lid 3, and a metal layer 6.

The semiconductor substrate 4 has a first surface 4h, at which an integrated circuit 41 is provided, and a second surface 4r, which is a rear surface with respect to the first surface 4h, which is a front surface.

The lid 3 is a box-shaped lid having a recess 32, which opens toward the first surface 4h of the semiconductor substrate 4, and a contact surface 31, which is in contact with the first surface 4h of the semiconductor substrate 4. The situation in which the contact surface 31 of the lid 3 is in contact with the first surface 4h of the semiconductor substrate 4 does not necessarily mean direct contact between the contact surface 31 of the lid 3 and the first surface 4h of the semiconductor substrate 4 and includes contact between the first surface 4h of the semiconductor substrate 4 and the contact surface 31 of the lid 3, for example, via the metal layer 6.

The metal layer 6 is a bonding portion that bonds the semiconductor substrate 4 to the lid 3 and is disposed between the first surface 4h of the semiconductor substrate 4 and the contact surface 31 of the lid 3. The lid 3, specifically, the contact surface 31 is bonded to the first surface 4h of the semiconductor substrate 4 via the metal layer 6.

At least part of the integrated circuit 41 overlaps with the metal layer 6 in the plan view viewed in the direction Z, which is the direction of a normal to the first surface 4h of the semiconductor substrate 4. In other words, at least part of the integrated circuit 41 overlaps in the plan view with the metal layer 6, that is, the bonding portion that bonds the semiconductor substrate 4 to the lid 3.

The vibration element 5 is disposed at the first surface 4h of the semiconductor substrate 4. The first surface 4h of the semiconductor substrate 4 is bonded to the contact surface 31 of the lid 3, so that the vibration element 5 is accommodated in the recess 32 of the lid 3. In other words, the opening of the recess 32 of the lid 3 is closed by the semiconductor substrate 4, so that an accommodation space S, in which the vibration element 5 is accommodated at the first surface 4h of the semiconductor substrate 4, is formed.

The semiconductor substrate 4 has the shape of a planar plate and has the first surface 4h, which is the upper surface, and the second surface 4r, which is the lower surface, as shown in FIGS. 2 and 3. The second surface 4r is the rear surface, and the first surface 4h is the front surface. A frame-shaped first metal layer 61, which is disposed along the outer edge of the first surface 4h, is provided at the first surface 4h of the semiconductor substrate 4.

The first metal layer 61 is formed of a gold (Au) layer having a thickness of 100 nm in the present embodiment. The first metal layer 61 may be made of a metal other than gold (Au), for example, copper (Cu).

In the present embodiment, a close contact layer that is not shown is provided between the first metal layer 61 and the first surface 4h of the semiconductor substrate 4. The close contact layer has the function of improving the degree of the close contact between the first metal layer 61 and the first surface 4h of the semiconductor substrate 4. The close contact layer is formed of a titanium (Ti) layer having a thickness of 5 nm. The close contact layer may be made of a metal other than titanium (Ti), for example, tungsten (W). The close contact layer may not be provided.

The lid 3 has the recess 32, which is a bottomed recess that opens toward the first surface 4h of the semiconductor substrate 4, that is, downward, and the contact surface 31, which is provided in the form of a frame along the outer edge of the recess 32 and is in contact with the first surface 4h of the semiconductor substrate 4. In the present embodiment, the lid 3 is formed of a silicon substrate. The lid 3 may, however, be made of a material other than silicon, for example, a glass or ceramic material.

A second metal layer 62 is provided at the contact surface 31 along the entire circumference thereof.

The second metal layer 62 is formed of a gold (Au) layer having a thickness of 20 nm in the present embodiment. The second metal layer 62 may be made of a metal other than gold (Au), for example, copper (Cu).

In the present embodiment, a close contact layer that is not shown is provided between the second metal layer and the contact surface 31 of the lid 3. The close contact layer has the function of improving the degree of the close contact between the second metal layer 62 and the contact surface 31 of the lid 3. The close contact layer is formed of a titanium (Ti) layer having a thickness of 5 nm. The close contact layer may be made of a metal other than titanium (Ti), for example, tungsten (W). The close contact layer may not be provided.

The first metal layer 61, which is provided at the first surface 4h of the semiconductor substrate 4, and the second metal layer 62, which is provided at the contact surface 31, are bonded to each other by activated bonding to form the metal layer 6. The contact surface 31 of the lid 3 and the first surface 4h of the semiconductor substrate 4 are thus bonded to each other via the metal layer 6.

Activated bonding is a bonding method for bonding the first metal layer 61 and the second metal layer 62 to each other by radiating, for example, a neutral argon ion beam to the first metal layer 61 and the second metal layer 62 to activate the surfaces of the first metal layer 61 and the second metal layer 62 and then causing the first metal layer 61 and the second metal layer 62 to come into contact with each other. According to the thus performed activated bonding, the metal atoms at the surfaces of the first metal layer 61 and the second metal layer 62, in the present embodiment, gold (Au) atoms diffuse and re-organize in the surface where the first metal layer 61 and the second metal layer 62 come into contact with each other, resulting in strong bonding between the first metal layer 61 and the second metal layer 62 with no bonding interface. Instead, smoothing the surfaces of the first metal layer 61 and the second metal layer 62 allows the bonding only with the free surface energy of the surfaces of the first metal layer 61 and the second metal layer 62, whereby the bonding can be performed at room temperature without active pressure.

As described above, since excessive pressure or heat is not applied during the bonding process, damage to the integrated circuit 41 at the time of bonding can be reduced even when at least part of the integrated circuit 41 overlaps in the plan view with the metal layer 6, that is, the bonding portion where the semiconductor substrate 4 is bonded to the lid 3. At least a part of the integrated circuit 41 is thus allowed to overlap in the plan view with the bonding portion that bonds the semiconductor substrate 4 to the lid 3, whereby the size of the vibration device 1 can be reduced.

In the present embodiment, the first metal layer 61 on the semiconductor substrate 4 and the second metal layer 62 on the lid 3 are bonded to each other by activated bonding, and atomic diffusion bonding may instead be used. Using atomic diffusion bonding allows the first metal layer 61 on the semiconductor substrate 4 and the second metal layer 62 on the lid 3 to be bonded to each other without applying excessive pressure or heat during the bonding process, as in the case of the activated bonding.

Furthermore, in the present embodiment, the first metal layer 61 and the second metal layer 62 contain gold (Au), as described above. Specifically, the first metal layer 61 and the second metal layer 62 are made of gold (Au). Using gold (Au) causes no formation of any metal oxide film on the surfaces of the first metal layer 61 and the second metal layer 62, whereby the bonding can be readily performed because removal of a metal oxide film is not required in the activation bonding or the atomic diffusion bonding.

A third metal layer 63 is provided at a bottom surface 321 of the recess 32 of the lid 3. The third metal layer 63 is provided over the entire bottom surface 321 and overlaps with at least part of the vibration element 5 in the plan view viewed in the direction Z, which is the direction of a normal to the first surface 4h of the semiconductor substrate 4. A fourth metal layer 64 is provided at the entirety of a side surface 322 of the recess 32. The third metal layer 63 is electrically continuous with the metal layer 6 through the fourth metal layer 64. Providing the third metal layer 63 and the fourth metal layer 64 allows the third metal layer 63 and the fourth metal layer 64 to function as shielding layers and protect the integrated circuit 41 and the vibration element 5 from disturbances, such as unwanted radiation.

In the present embodiment, the fourth metal layer is provided over the entire side surface 322 of the recess 32 and may instead not be provided over the entire side surface 322 of the recess 32. The configuration in which the fourth metal layer 64 causes electrical continuity between the metal layer 6 and the third metal layer 63 allows the third metal layer 63 to function as a shielding layer, whereby the integrated circuit 41 and vibration element 5 can be protected from disturbances, such as unwanted radiation.

In the present embodiment, the third metal layer 63 and the fourth metal layer 64 are made of gold (Au), as the second metal layer 62 is. Close contact layers that are not shown but are made of titanium (Ti) are provided between the third metal layer 63 and the bottom surface 321 of the recess 32 and between the fourth metal layer 64 and the side surface 322 of the recess 32.

Setting the thickness of the third metal layer 63 at a value smaller than or equal to 20 nm allows infrared light to pass through the third metal layer 63. Since the lid 3 is formed of a silicon substrate as described above, and silicon transmits infrared light, setting the thickness of the third metal layer 63 at a value smaller than or equal to 20 nm allows use of infrared light to inspect the interior of the vibration device 1, specifically, for example, the vibration element 5 accommodated in the accommodation space S via the lid 3 and the third metal layer 63. Radiating infrared laser light to the vibration element 5 via the lid 3 and the third metal layer 63 further allows removal of part of the vibration element 5 and adjustment of the resonant frequency of the vibration element 5.

The semiconductor substrate 4 includes a base substrate 40 having the shape of a planar plate, the integrated circuit 41 provided at the upper surface of the base substrate 40, and an insulating layer 42 provided at the upper surface of the integrated circuit 41. In other words, the integrated circuit 41 and the insulating layer 42 are provided at the first surface 4h of the semiconductor substrate 4. In the present embodiment, the base substrate is a silicon substrate. The base substrate 40 may, however, be made of a semiconductor other than silicon, for example, gallium nitride.

The insulating layer 42 is made of an SiO$_2$ layer having a thickness of 1 μm and covers the upper surface of the integrated circuit 41. The insulating layer 42 has the function of protecting the integrated circuit 41. The insulating layer 42 may not be provided.

A mount electrode 72 is provided at the upper surface of the insulating layer 42 of the semiconductor substrate 4. The mount electrode 72 is electrically coupled to the integrated circuit and 41 via wiring lines 404, which pass through the insulating layer 42, and terminals that are not shown in the figures but are provided at the upper surface of the integrated circuit 41. The mount electrode 72 is used to electrically couple the vibration element 5, which will be described later, to the integrated circuit 41.

The integrated circuit 41 is a circuit in which a plurality of transistors and other active elements that are not shown in the figures are electrically coupled to each other via wiring lines that are not shown in the figures. The circuit is not limited to a specific circuit and may, for example, be an oscillation circuit that causes the vibration element 5 to oscillate to generate the frequency of a reference signal, such as a clock signal, a temperature compensation circuit that corrects the vibration characteristics of the vibration element 5 in accordance with temperature changes, a processing circuit that processes the signal outputted from the oscillation circuit, or an electrostatic protection circuit.

The integrated circuit 41 includes a plurality of terminals that are not shown in the figures. The plurality of terminals are formed at the upper and lower surfaces of the integrated circuit 41 and electrically coupled to the integrated circuit 41. The plurality of terminals include a terminal coupled to a power supply potential, a terminal coupled to a ground potential, and a terminal via which an oscillation signal is outputted.

The integrated circuit 41 includes wiring lines 45 as part of the integrated circuit 41 in the area where the integrated circuit 41 overlaps with the metal layer 6 in the plan view viewed in the direction Z, which is the direction of a normal to first surface 4h of the semiconductor substrate 4. The wiring lines 45 provided in the integrated circuit 41 are arranged in the form a frame, that is, a closed curve along the outer edge of the integrated circuit 41.

The wiring lines 45 function as a power supply wiring line that supplies the power supply potential via the terminal coupled to the power supply potential electrically coupled to the integrated circuit 41 and as a ground wiring line that supplies the ground potential via the terminal coupled to the ground potential and the electrostatic protection circuit. The integrated circuit and vibration element 5 can thus be protected from disturbances, such as unwanted radiation. Arranging the wiring lines 45 along the closed curve allows improvement in the effect of further protecting the integrated circuit and vibration element 5 from disturbances, such as unwanted radiation. The wiring lines 45 may not include the power supply wiring line or the ground wiring line as long as the wiring lines 45 include fixed potential wiring lines that supply fixed potentials, such as the power supply potential and the ground potential.

The configuration in which wiring lines that are not shown in the figures but pass through the insulating layer 42 electrically couple the wiring lines 45 to the metal layer 6 allows further improvement in the effect of protecting the integrated circuit 41 and the vibration element 5 from disturbances, such as unwanted radiation.

The base substrate 40 of the semiconductor substrate 4 has through holes 400, which pass through the base substrate 40 in the direction Z, which is the thickness direction, insulating layers 401, which are provided at the inner wall surfaces of the through holes 400, and through electrodes 402, which are inserted into the through holes 400.

The base substrate 40 of the semiconductor substrate 4 further includes insulating layers 46 provided at the lower surface of the base substrate 40 and external terminals 70 provided at the lower surfaces of the insulating layers 46. In other words, the insulating layers 46 and the external terminals 70 are provided at the second surface 4r of the semiconductor substrate 4.

The upper surfaces of the through electrodes 402 are electrically coupled to the integrated circuit 41 via terminals that are not shown but are disposed at the lower surface of the integrated circuit 41. The lower surfaces of the through electrodes 402 are electrically coupled to the external terminals 70. Electrically coupling the external terminals 70 to the integrated circuit 41 via the through electrodes 402 and the terminals that are not shown in the figures allows the power supply potential and the ground potential to be supplied to the integrated circuit 41 and the clock signal and other signals to be outputted from the integrated circuit 41 via the external terminals 70.

As described above, electrically coupling the external terminals 70 provided at the second surface 4r of the semiconductor substrate 4 to the integrated circuit 41 via the through electrodes 402 allows the dimensions of the vibration device 1 to be substantially equal to the dimensions of the integrated circuit 41 in the plan view viewed in the direction Z, whereby the size of the vibration device 1 can be reduced.

The vibration element 5 includes a vibration substrate 51, excitation electrodes 52 disposed at the upper and lower surfaces of the vibration substrate 51, a pair of terminals 53 disposed at the lower surface of the vibration substrate 51, and wiring lines 54 electrically coupling the excitation electrodes 52 to the terminals 53. In the present embodiment, the vibration substrate 51 is a quartz substrate. The vibration substrate 51 is not limited to a quartz substrate and may instead be a piezoelectric crystal element made, for example, of lithium niobate or lithium tantalate.

The pair of terminals 53 disposed at the lower surface of the vibration element 5 and the mount electrode 72 provided at the first surface 4h of the semiconductor substrate 4 are bonded to each other via an electrically conductive bonding member 56, so that the vibration element 5 is fixed to and disposed at the first surface 4h of the semiconductor substrate 4. Further, since the mount electrode 72 is electrically coupled to the integrated circuit 41 as described above, the excitation electrodes 52, which are disposed at the upper and lower surfaces of the vibration substrate 51 of the vibration element 5, are electrically coupled to the integrated circuit 41 via the mount electrode 72, the electrically conductive bonding member 56, the terminals 53 disposed at the vibration substrate 51, and the wiring lines 54 coupled to the excitation electrode 52, so that the oscillation signal outputted from the integrated circuit 41 allows the vibrating element 5 to oscillate.

Examples of the electrically conductive bonding member 56 may include a variety of metal bumps, such as gold bumps and solder bumps, and an electrically conductive adhesive in which electrically conductive fillers, such as silver fillers, are dispersed in a resin adhesive, such as an epoxy-based or silicone-based adhesive.

A method for manufacturing the vibration device 1 will next be described with reference to FIGS. 4 to 9. The method for manufacturing the vibration device 1 includes a semiconductor substrate formation step, a vibration element mounting step, a lid formation step, a bonding step, and an individualization step, as shown in FIG. 4.

1.1 Semiconductor Substrate Formation Step

Figure 4:
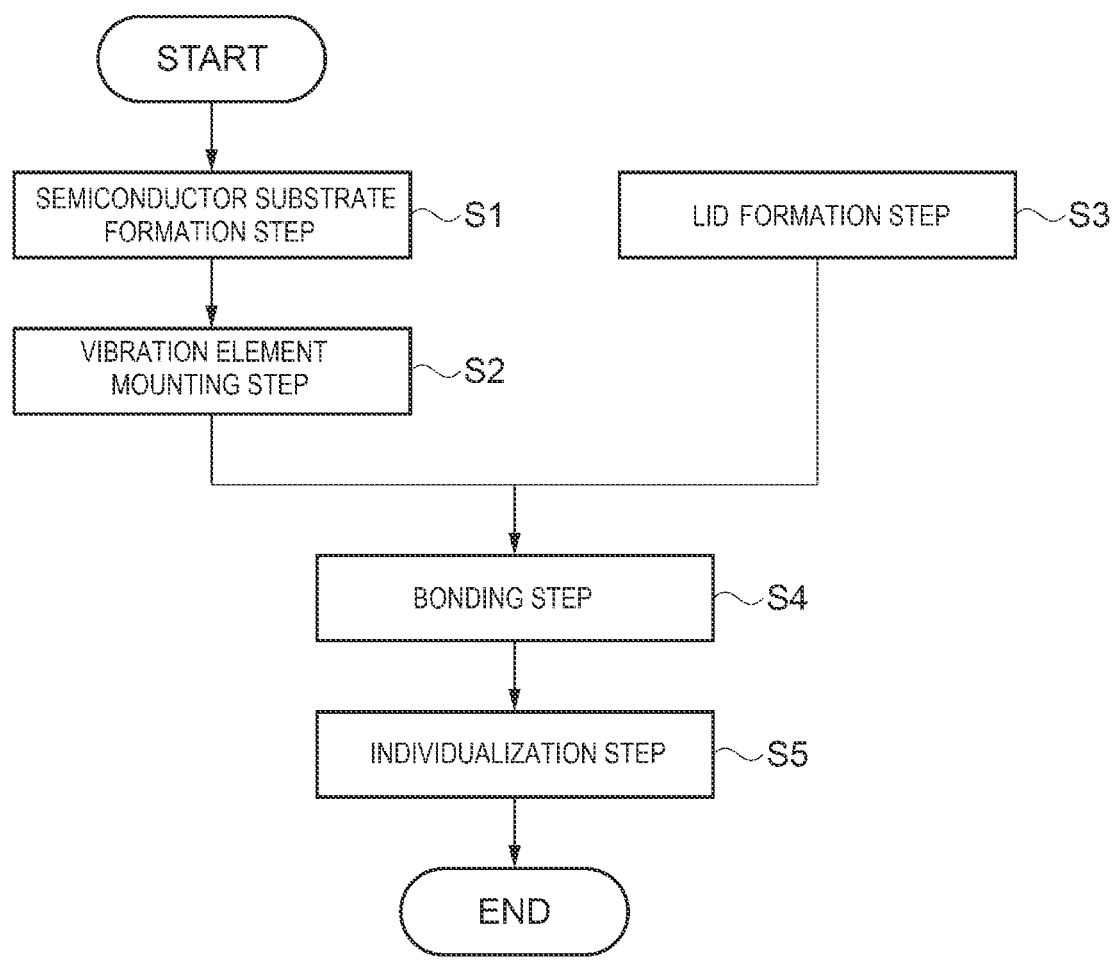
FIG. 4 is a flowchart showing key processes of manufacturing the vibration device according to the first embodiment.
Figure 5:
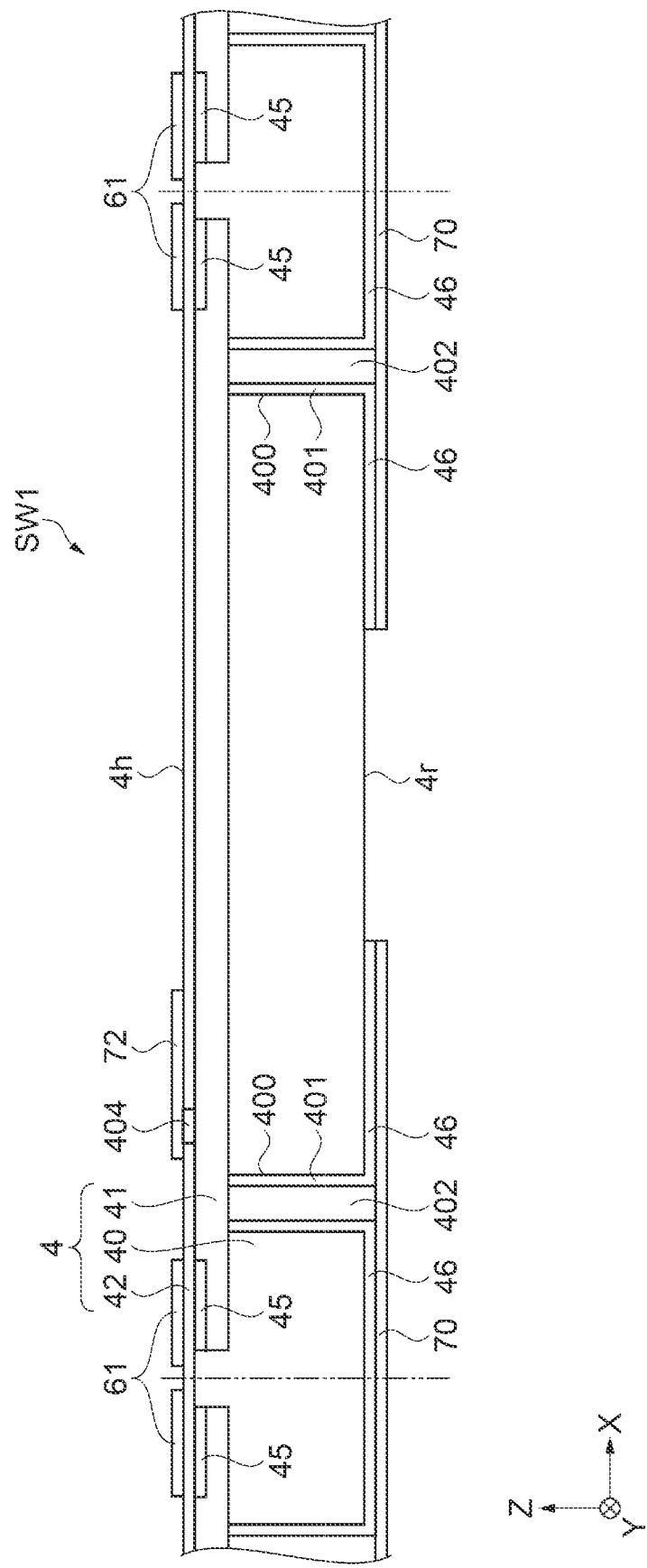
FIG. 5 is a cross-sectional diagrammatic view showing the processes of manufacturing the vibration device according to the first embodiment.

In step S1, the semiconductor substrate 4 is formed, as shown in FIGS. 4 and 5. A silicon wafer SW1 including a plurality of base substrates 40 integrated with each other is prepared, and the through holes 400 are formed by using a silicon etching technology, such as the Bosch process. After the insulating layers 401 are formed at the inner walls of the through holes 400, the through electrodes 402 is formed by filling the through holes 400 with polysilicon into which boron ions have been implanted. After the formation of the through electrodes 402, the integrated circuits 41 each including the wiring lines 45 are formed at the upper surfaces of the plurality of base substrates 40. After the formation of the integrated circuits 41, the insulating layers 42 and the insulating layers 46 are formed, and the external terminals 70, the wiring lines 404, the mount electrodes 72, and the first metal layers 61 are further formed.

The insulating layers 46 and the external terminals 70 to be provided at the lower surfaces of the base substrates 40 may instead be formed after the bonding step, which will be described later.

In step S1, the mount electrodes 72 and the first metal layers 61 can be formed at the same time, for example, by depositing gold (Au) in a process using a sputtering technology and patterning the resultant film in a process using photolithography and etching technologies.

1.2 Vibration Element Mounting Step

Figure 6:
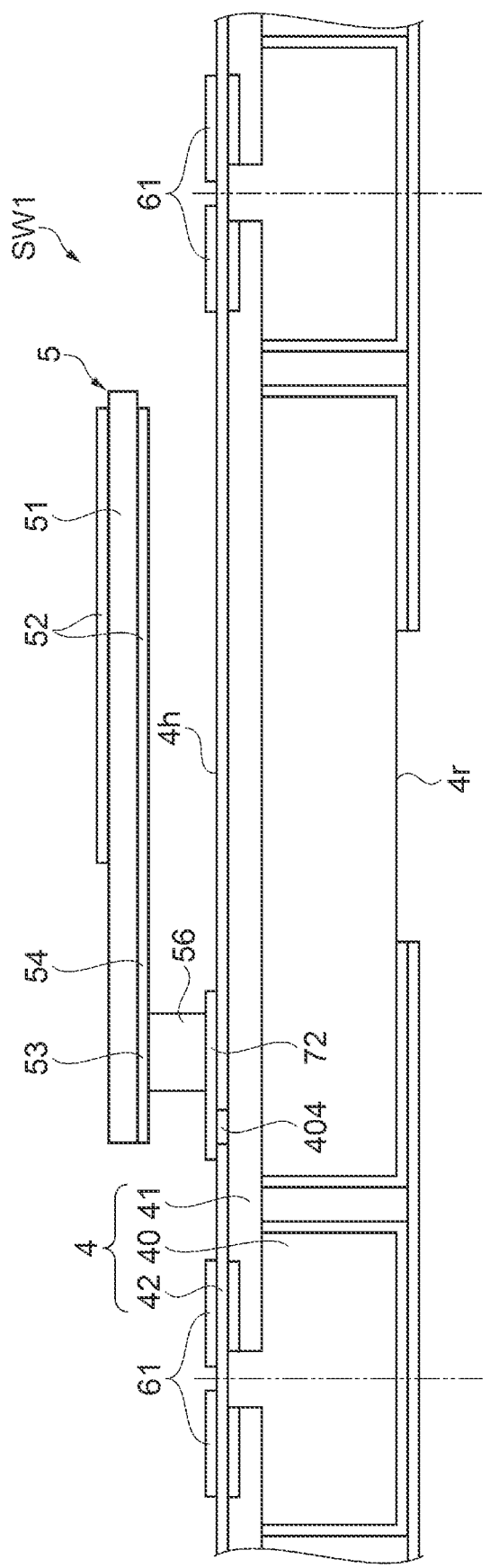
FIG. 6 is a cross-sectional diagrammatic view showing the processes of manufacturing the vibration device according to the first embodiment.

In step S2, the terminals 53 disposed at the lower surfaces of the vibration elements 5 and the mount electrodes 72 provided at the first surfaces 4h of the semiconductor substrates 4 are bonded to each other via the electrically conductive bonding members 56, as shown in FIGS. 4 and 6. The vibration elements 5 are thus fixed to the first surfaces 4h of the semiconductor substrates 4.

1.3 Lid Formation Step

Figure 7:
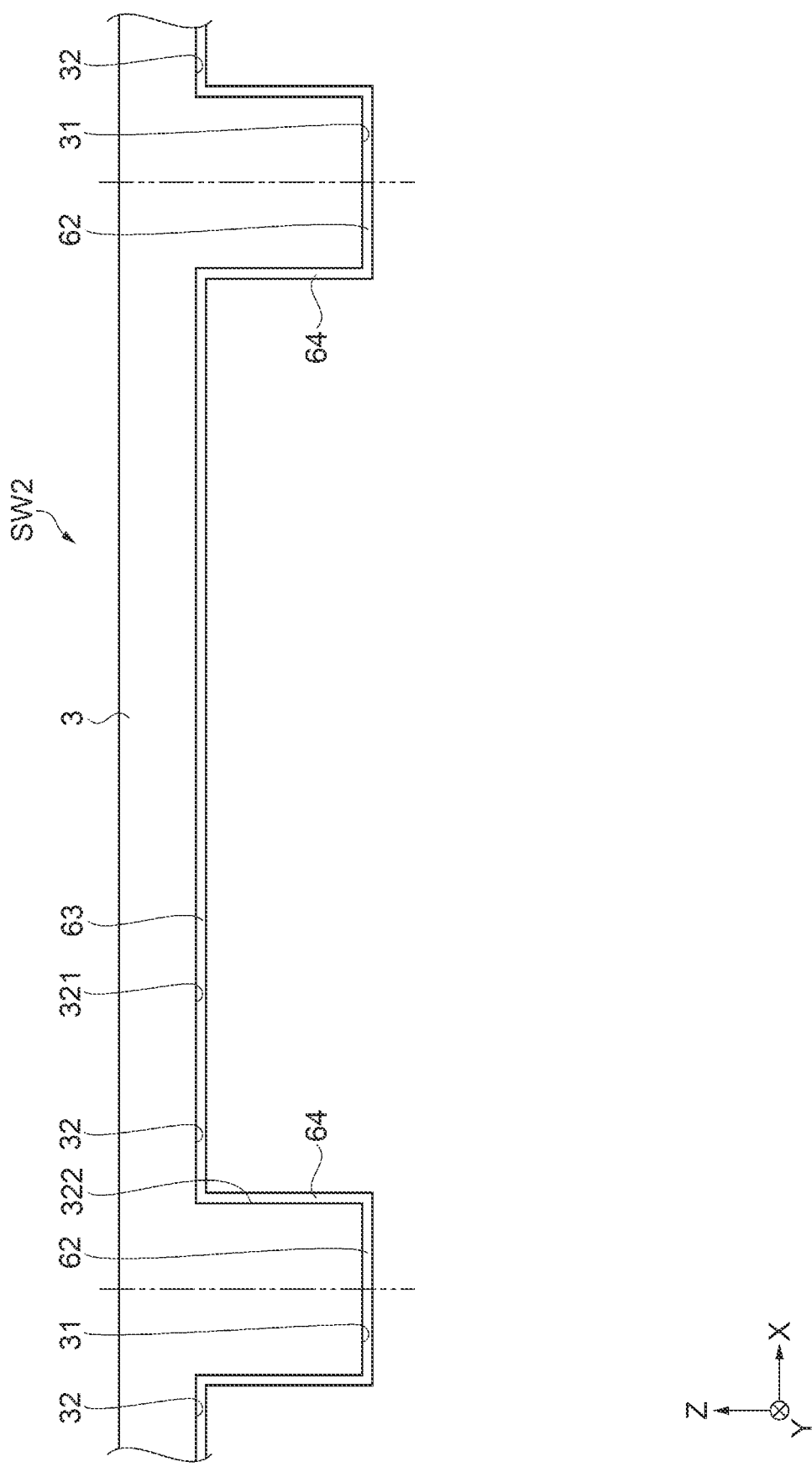
FIG. 7 is a cross-sectional diagrammatic view showing the processes of manufacturing the vibration device according to the first embodiment.

In step S3, the lids 3 are formed, as shown in FIGS. 4 and 7. A silicon wafer SW2 including a plurality of lids 3 integrated with one another is prepared, and the recesses 32 are formed in the lower surfaces of the silicon wafers SW2, that is, the lower surfaces of the lids 3 by using a silicon etching technology, such as the Bosch process. After the formation of the recesses 32, the second metal layers 62 are formed at the contact surfaces 31 provided along the outer edges of the recesses 32 of the lids 3, the third metal layers 63 are formed at the bottom surfaces 321 of the recesses 32 of the lids 3, and the fourth metal layers 64 are formed at the side surfaces 322 of the recesses 32. The second metal layers 62, the third metal layers 63, and the fourth metal layers 64 can be formed simultaneously, for example, by depositing gold (Au) over the entire lower surfaces of the silicon wafers SW2 by using a sputtering technology.

1.4 Bonding Step

Figure 8:
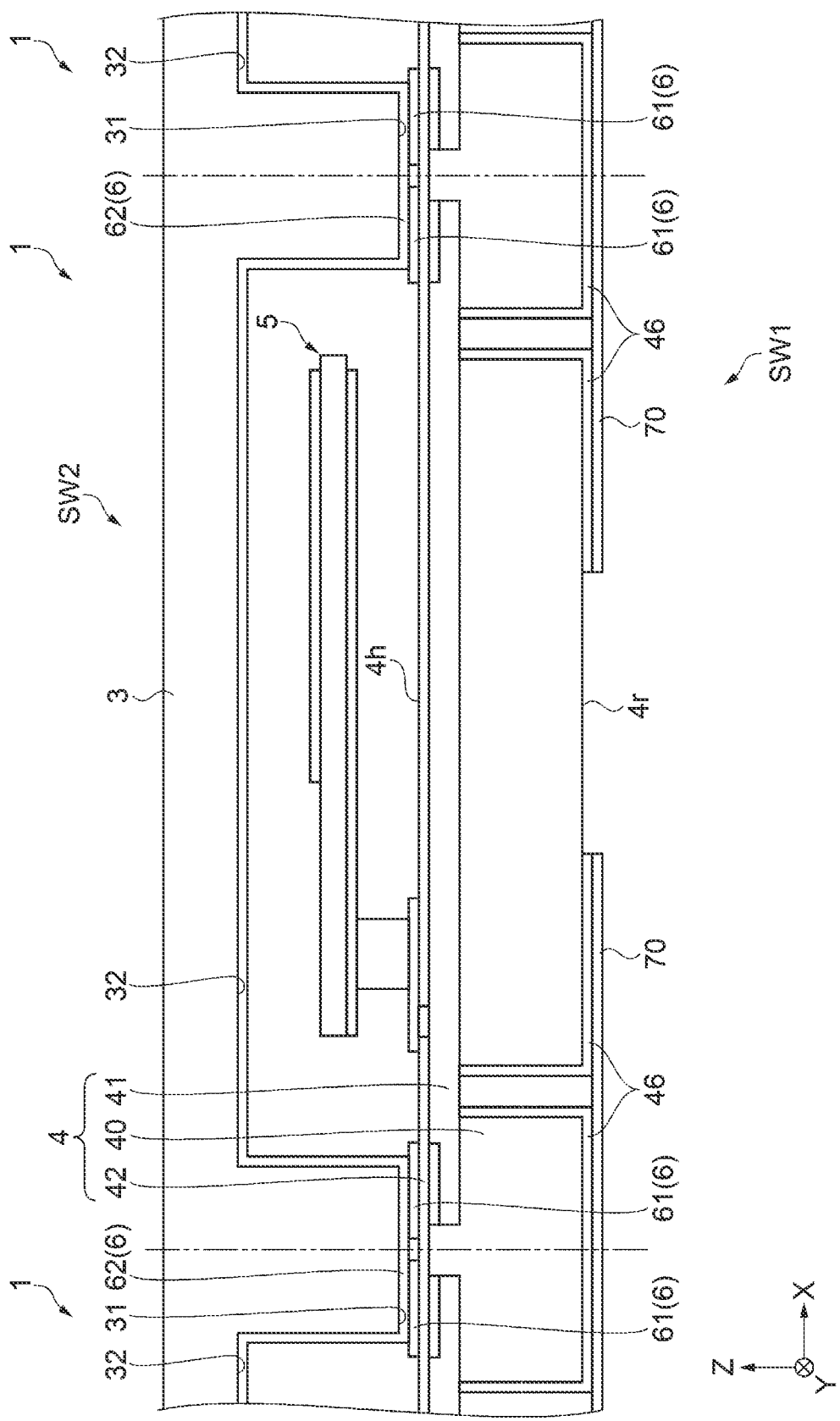
FIG. 8 is a cross-sectional diagrammatic view showing the processes of manufacturing the vibration device according to the first embodiment.

In step S4, the first surfaces 4h of the semiconductor substrates 4 and the contact surfaces 31 of the lids 3 are bonded to each other via the first metal layers 61 and the second metal layers 62, as shown in FIGS. 4 and 8. The activated bonding is used as the bonding method in the present embodiment, as described above. The activated bonding allows the first metal layers 61 and the second metal layers 62 to be bonded to each other to form the metal layers 6. The silicon wafer SW1 and the silicon wafer SW2 are thus attached to each other to provide a silicon wafer formed of a plurality of vibration devices 1 integrated with each other.

After the bonding step, the silicon wafer may be polished or ground to reduce the thickness of the vibration devices 1.

Specifically, the upper surface of the silicon wafer formed of the plurality of vibration devices 1 integrated with each other, that is, the upper surfaces of the lids 3 may be polished or ground to reduce the thickness of the vibration devices 1, or the lower surface of the silicon wafer, that is, the second surfaces 4r of the semiconductor substrates 4, may be polished or ground to reduce the thickness of the vibration devices 1.

In the present embodiment, since the integrated circuits 41 and the vibration elements 5 are provided at the first surfaces 4h of the semiconductor substrates 4, the thickness of the vibration devices 1 can be reduced by polishing or grinding the second surfaces 4r of the semiconductor substrates 4, which are the rear surfaces with respect to the first surfaced 4h of the semiconductor substrates 4, which are the front surfaces. Since the first surfaces 4h of the semiconductor substrates 4, on which the vibration elements 5 are mounted, do not need to be ground or polished before the vibration elements 5 are mounted as described above, the thickness of the vibration devices 1 can be readily reduced.

When the thickness of the silicon wafer is reduced by polishing or grinding the second surfaces 4r of the semiconductor substrates 4 after the bonding process, the insulating layers 46 and the external terminals 70 are formed at the second surfaces 4r of the semiconductor substrates 4 after the thickness reduction process.

1.5 Individualization Step

Figure 9:
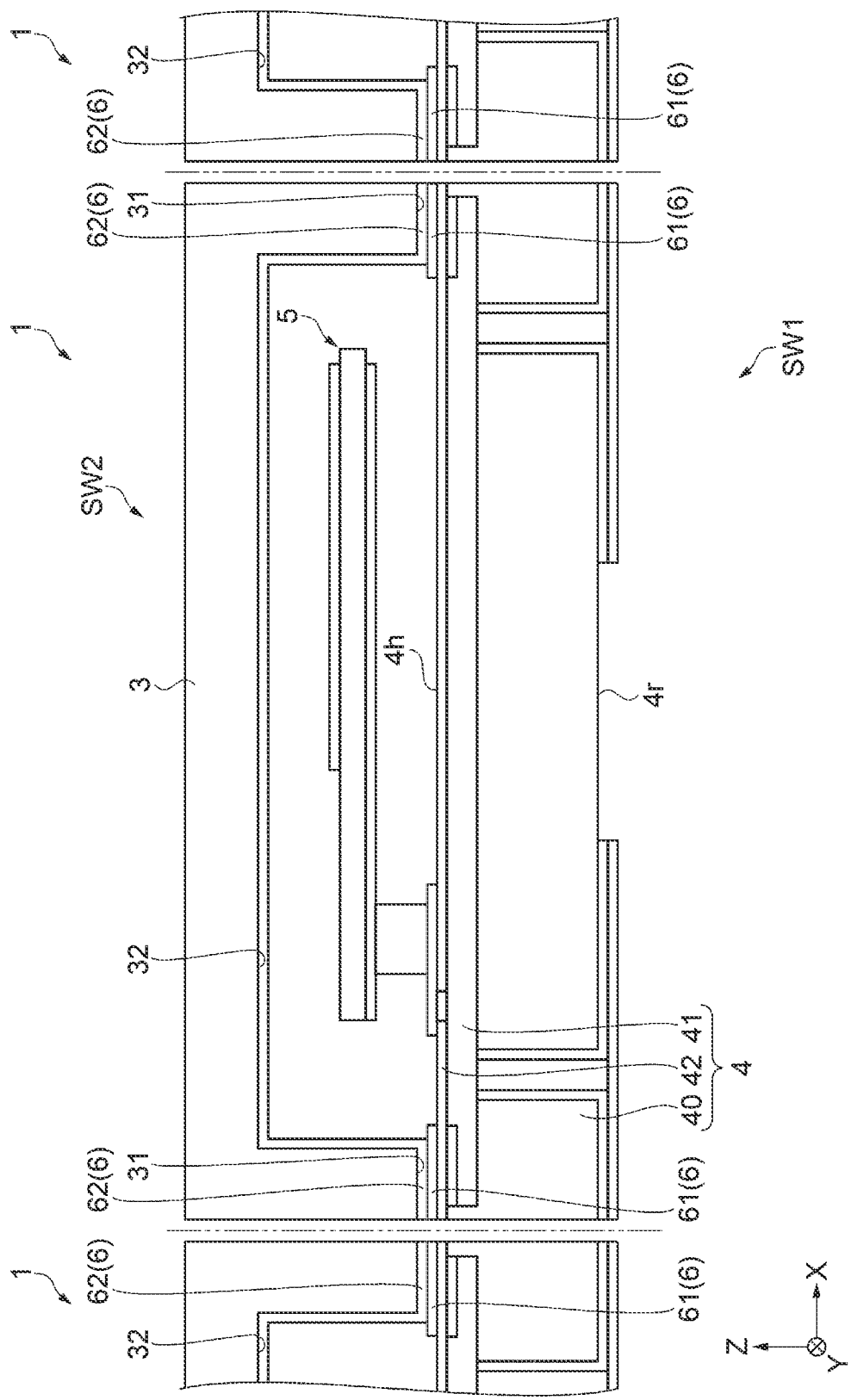
FIG. 9 is a cross-sectional diagrammatic view showing the processes of manufacturing the vibration device according to the first embodiment.

In step S5, the vibration devices 1 are separated from the silicon wafer by using dicing or any other cutting method, as shown in FIGS. 4 and 9.

The vibration devices 1 can be manufactured by carrying out the manufacturing steps described above.

The present embodiment can provide the effects below, as described above. The vibration device 1 includes the semiconductor substrate 4, which has the first surface 4h, at which the integrated circuit 41 and the vibration element 5 are provided, the lid 3, which has the contact surface 31 in contact with the first surface 4h and is bonded to the first surface 4h via the contact surface 31, and the metal layer 6, which is disposed between the first surface 4h and the contact surface 31. In the plan view viewed in the direction Z, which is the direction of a normal to the first surface 4h, at least part of the integrated circuit 41 overlaps with the metal layer 6, which is the portion where the semiconductor substrate 4 and the lid 3 are bonded to each other, whereby the size of the vibration device 1 can be reduced.

Furthermore, since the second surface 4r of the semiconductor substrate 4, which is the surface at which the integrated circuit 41 or the vibration element 5 is not provided, can be polished or ground, the thickness of the vibration device 1 can be readily reduced.

The vibration device 1 described above can be preferably used as an oscillator and an inertia sensor, such as an acceleration sensor and an angular velocity sensor.

What is claimed is:

1. A vibration device comprising:
a semiconductor substrate having a first surface at which an integrated circuit is provided and a second surface that is a rear surface with respect to the first surface, which is a front surface;
a vibration element disposed at the first surface;
a lid having a recess that opens toward the first surface and a contact surface that is in contact with the first surface in such a way that the vibration element is accommodated in the recess, the lid being bonded to the first surface via the contact surface; and
a metal layer disposed between the first surface and the contact surface, wherein
at least part of the integrated circuit overlaps with the metal layer in a plan view viewed in a direction of a normal to the first surface
a third metal layer that is electrically continuous with the metal layer is provided at a bottom surface of the recess of the lid, and
the lid is formed of a silicon substrate, the third metal layer has a thickness smaller than or equal to 20 nm, and infrared light can pass through the lid and the third metal layer.

2. The vibration device according to claim 1, wherein the metal layer is formed of a first metal layer provided at the first surface and a second metal layer provided at the contact surface, the first and second metal layers being bonded to each other by activated bonding.

3. The vibration device according to claim 1, wherein the metal layer contains Au.

4. The vibration device according to claim 1, wherein a wiring line is provided as part of the integrated circuit in an area where at least part of the integrated circuit overlaps with the metal layer in the plan view, and the wiring line is a fixed potential wiring line.

5. The vibration device according to claim 1, wherein a wiring line is provided as part of the integrated circuit in an area where at least part of the integrated circuit overlaps with the metal layer in the plan view, and the wiring line is a power supply wiring line.

6. The vibration device according to claim 4, wherein the wiring has a shape of a closed curve in the plan view.

7. A vibration device comprising:
a semiconductor substrate having a first surface at which an integrated circuit is provided and a second surface that is a rear surface with respect to the first surface which is a front surface;
a vibration element disposed at the first surface;
a lid having a recess that opens toward the first surface and a contact surface that is in contact with the first surface in such a way that the vibration element is accommodated in the recess, the lid being bonded to the first surface via the contact surface; and
a metal layer disposed the first surface and the contact surface, wherein
at least part of the integrated circuit overlaps with the metal layer in a plan view viewed in a direction of a normal to the first surface, and
an insulating layer is provided between the metal layer and the integrated circuit.

8. A vibration device comprising:
a semiconductor substrate having a first surface at which an integrated circuit is provided and a second surface that is a rear surface with respect to the first surface which is a front surface;
a vibration element disposed at a first surface;
a lid having a recess that opens toward the first surface and a contact surface that is in contact with the first surface in such a way that the vibration element is accommodated in the recess, the lid being bonded to the first surface via the contact surface; and
a metal layer disposed between the first surface and the contact surface, wherein
at least part of the integrated circuit overlaps with the metal layer in a plan view viewed in a direction of a normal to the first surface, and
an external terminal is provided at the second surface, and the integrated circuit is electrically coupled to the external terminal via a through electrode provided in the semiconductor substrate.

\* \* \* \* \*